United States Patent
Yokoyama

(10) Patent No.: US 6,995,517 B2
(45) Date of Patent: Feb. 7, 2006

(54) COLOR ELECTROLUMINESCENCE DISPLAY DEVICE

(75) Inventor: Ryoichi Yokoyama, Ohgaki (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/175,978

(22) Filed: Jun. 20, 2002

(65) Prior Publication Data

US 2003/0011316 A1 Jan. 16, 2003

Related U.S. Application Data

(62) Division of application No. 09/451,454, filed on Nov. 30, 1999, now Pat. No. 6,433,486.

(30) Foreign Application Priority Data

Dec. 1, 1998 (JP) .......................... 10-341860
Oct. 1, 1999 (JP) .......................... 11-281789

(51) Int. Cl.
*G09G 3/10* (2006.01)

(52) U.S. Cl. ................ 315/169.3; 345/76; 313/506
(58) Field of Classification Search .......... 315/169.1, 315/169.3; 345/44–45, 55, 76–77, 80; 313/484, 313/505, 506, 494, 498
See application file for complete search history.

(56) References Cited

U.S. PATENT DOCUMENTS 4,904,989 A 2/1990 Matsui et al. .............. 345/76
5,159,476 A 10/1992 Hayashi ...................... 349/39
5,384,517 A 1/1995 Uno .......................... 315/169.3

(Continued)

FOREIGN PATENT DOCUMENTS

| EP | 0 717 445 | 6/1996 |
| EP | 0 717 446 A2 | 6/1996 |
| EP | 0 880 303 A1 | 11/1998 |

(Continued)

OTHER PUBLICATIONS

A copy of excerpt English translation of Japanese Patent Laid–Open Publication No. Sho 58–140781.
A copy of excerpt English translation of Japanese Patent Laid–Open Publication No. Hei 7–6875.

(Continued)

*Primary Examiner*—Tuyet Vo
*Assistant Examiner*—Jimmy Vu
(74) *Attorney, Agent, or Firm*—Cantor Colburn LLP

(57) ABSTRACT

A part of a capacitor is disposed in the horizontal direction of a luminescent region so as to secure a gap in the horizontal direction of the luminescent region. As the distance between adjoining pixels in the horizontal direction is thus secured, color mixing is unlikely, even when an error is caused in positioning a metal mask when forming luminescent layers by evaporation. Further, a portion of the capacitor or TFTs is also disposed in the vertical direction of the luminescent region. Therefore, enhanced color purity can even be achieved for pixels adjoining one another in the column direction in the delta pixel arrangement.

24 Claims, 8 Drawing Sheets

U.S. PATENT DOCUMENTS

| | | | |
|---|---|---|---|
| 5,399,936 A | 3/1995 | Namiki et al. | 313/504 |
| 5,550,066 A | 8/1996 | Tang et al. | 438/29 |
| 5,670,792 A | 9/1997 | Utsugi et al. | 257/59 |
| 5,684,365 A | 11/1997 | Tang et al. | 313/504 |
| 5,742,129 A | 4/1998 | Nagayama et al. | 315/167 |
| 5,747,930 A | 5/1998 | Utsugi | 315/169.3 |
| 5,822,026 A | 10/1998 | Matsuo | 349/38 |
| 5,838,289 A | 11/1998 | Saito et al. | 345/29 |
| 5,852,481 A | 12/1998 | Hwang | 349/43 |
| 5,897,328 A | 4/1999 | Yamauchi et al. | 438/29 |
| 5,920,080 A | 7/1999 | Jones | 257/40 |
| 5,966,189 A | 10/1999 | Matsuo | 349/38 |
| 5,990,629 A | 11/1999 | Yamada et al. | 315/169.3 |
| 6,010,796 A | 1/2000 | Kijima | 428/690 |
| 6,133,693 A | 10/2000 | Keyser | 313/506 |
| 6,147,451 A | 11/2000 | Shibata et al. | 313/506 |
| 6,175,345 B1 | 1/2001 | Kuribayashi et al. | 345/76 |
| 6,429,599 B1 | 8/2002 | Yokoyama | 315/169.3 |
| 6,462,722 B1 | 2/2003 | Ozawa et al. | 315/169.3 |
| 6,522,315 B2 | 2/2003 | Ozawa et al. | 345/92 |
| 6,674,106 B2 * | 1/2004 | Tanaka et al. | 257/222 |
| 6,839,045 B2 | 1/2005 | Ozawa et al. | 315/169.1 |
| 2002/0196206 A1 | 12/2002 | Kimura et al. | |
| 2003/0098827 A1 | 5/2003 | Ozawa et al. | |
| 2003/0231273 A1 | 12/2003 | Kimura et al. | |
| 2004/0150591 A1 | 8/2004 | Ozawa et al. | |

FOREIGN PATENT DOCUMENTS

| | | |
|---|---|---|
| EP | 0 895 219 A1 | 2/1999 |
| JP | 58-140781 | 8/1983 |
| JP | 2-176725 | 7/1990 |
| JP | 2-245740 | 10/1990 |
| JP | 6208131 | 7/1994 |
| JP | 6308536 | 11/1994 |
| JP | 7-6875 | 1/1995 |
| JP | 8-43859 | 2/1996 |
| JP | 8-227276 | 9/1996 |
| JP | 9-274202 | 10/1997 |
| WO | WO 98/36406 | 2/1998 |

OTHER PUBLICATIONS

A copy of excerpt English translation of Japanese Patent Laid–Open Publication No. Hei 8–43859.

A copy of excerpt English translation of Japanese Patent Laid–Open Publication No. Hei 9–274202.

A copy of excerpt English translation of Japanese Patent Laid–Open Publication No. Hei 2–245740.

A copy of excerpt English translation of Japanese Patent Laid–Open Publication No. Hei 8–227276.

Notice of Grounds for Rejection for Japanese Patent Application Ser. No. Hei 11–281789 Aug. 27, 2002.

European Search Report for Application No. 99309642.9–2203 dated Nov. 18, 2004.

European Search Report for Application No. 99309646.0–2203 dated Nov. 18, 2004.

Copy of Appeal Decision mailed Jun. 14, 2005 for corresponding Japanese patent application No. Hei 11–281789 with complete English translation.

Japanese Patent Laid–Open Publication No. Hei 10–92574 with English abstract (none).

Japanese Patent Laid–Open Publication No. Hei 10–289784 with English abstract (none).

Office Actrion in connection with a related Japanese application, No. Hei 11–281789, issued on Dec. 21, 2004.

* cited by examiner

Fig. 4A
(PRIOR ART)
Fig. 4B
(PRIOR ART)
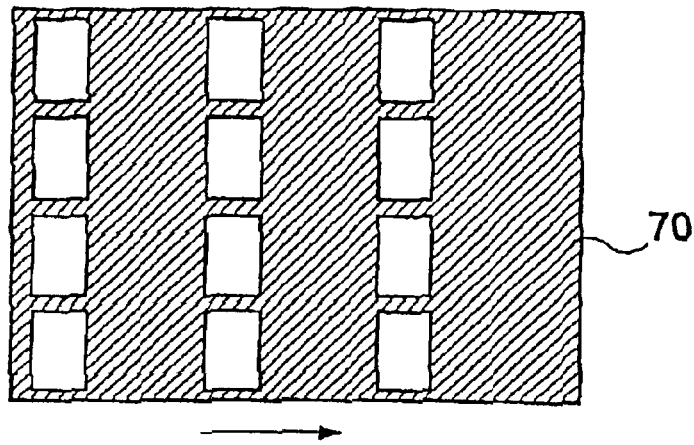
Fig. 4C
(PRIOR ART)
Fig. 4D
(PRIOR ART)
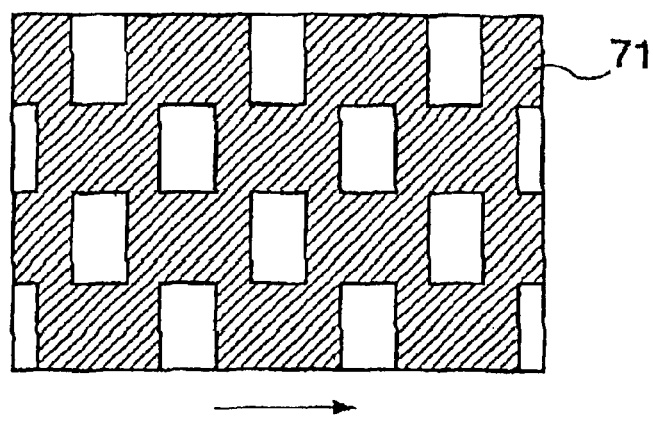

COLOR ELECTROLUMINESCENCE DISPLAY DEVICE

CROSS-REFERENCE TO RELATED APPLICATIONS

This application is a divisional application of U.S. patent application Ser. No. 09/451,454, filed on Nov. 30, 1999 U.S. Pat. No. 6,433,486, which is herein incorporated by reference in its entirety.

BACKGROUND OF THE INVENTION

1. Field of the Invention

The present invention relates to an active type color EL (electroluminescence) display device in which an electroluminescence (EL) element is driven using a thin film transistor (TFT).

2. Description of Related Art

Practical use of organic EL elements in next generation display devices is greatly expected, because such displays can eliminate need for a back light as required in a liquid crystal display device for self-emission, can be optimally made thin, and can have an unlimited viewing angle.

Three methods have commonly been proposed for achieving color display in a display device comprising such an organic EL element.

In the first method, different emissive materials for each of the primary RGB colors are used in corresponding emissive layers to individually form discrete color pixels directly emitting respective RGB light rays. In another method, an emissive layer generates white luminescence which is then converted into three primary colors using color filters. A third method is based on conversion of light from a blue emissive layer into three primary colors using color conversion mediums (CCM). As light energy is lost in the second and third methods above due to the use of color filters or color conversion mediums, the first method is the most effective of these in this respect because a desired light ray is directly emitted.

Meanwhile, to drive an organic EL display device, two types of driving methods, a passive type using a passive matrix and an active type employing TFTs, are available. The circuit configuration shown in FIG. 1 may be used in an active display.

FIG. 1 illustrates a circuit configuration for a single pixel in such a display pixel. Each pixel comprises an organic EL element 20, a first TFT 21 for switching, in which a display signal DATA is applied to a drain and a scan signal SCAN is applied to a gate to switch the TFT on and off, a capacitor 22 which is charged by a display signal DATA applied when the TFT 21 is on and which holds a charge voltage Vh when the TFT 21 is off, a second TFT 23 in which a drain is connected to a drive source of a voltage $V_{COM}$, a source is connected to an anode of the organic EL element 20 and a hold voltage Vh is applied to a gate from the capacitor 22 to drive the organic EL element 20.

A scan signal SCAN rises to an H level during one horizontal scanning period (1H). When the TFT 21 is switched on, a display signal DATA is applied to one end of the capacitor 22, which is then charged by a voltage Vh corresponding to the display signal DATA. This voltage Vh remains held in the capacitor 22 for one vertical scanning period (1V) even after the signal SCAN becomes a low level to switch the TFT 21 off. Because the voltage Vh is supplied to the gate of the TFT 23, the EL element is controlled so as to emit light with a luminance in accordance with the voltage Vh.

The conventional configuration of such an active type EL display device for achieving color display by means of the above-mentioned first method will be now described.

FIG. 2 depicts a conceptual plan view showing a configuration of a related art device, and FIG. 3 is a cross section taken along line C—C in FIG. 2. Each of the drawings depicts three pixels.

In FIGS. 2 and 3, numeral 50 represents a drain line for supplying a display signal DATA, numeral 51 represents a drive source line for supplying a supply voltage $V_{COM}$, and numeral 52 represents a gate line for supplying a scan signal SCAN. Further, numerals 53, 54, and 55 designate features corresponding the first TFT 21, the capacitor 22, and the second TFT 23 in FIG. 1, respectively, and numeral 56 designates an anode of the EL element 20 which constitutes a pixel electrode. As shown, discrete anodes 56 are separately formed for each pixel on a planarization insulating film 60. A hole-transport layer 61, an emissive layer 62, an electron-transport layer 63, and a cathode 64 are sequentially laminated on the discrete anode 56, thereby forming an EL element. Holes injected from the anodes 56 and electrons injected from the cathodes 64 are recombined inside the emissive layer 62, which emits light in the direction of the transparent anodes toward outside, as shown by arrows in FIG. 3. Here, discrete hole-transport layers 61, discrete emissive layers 62 and discrete electron-transport layers 63 having substantially the same shape as the discrete anodes 56 are provided for respective pixels. Emissive materials which are different for each RGB are used in the corresponding emissive layers 62, and therefore light rays having respective RGB colors are emitted from respective EL elements. The cathode 64, which applies a common voltage to each pixel, extends over the pixels. Partitions 68 are interposed between adjoining emissive layers 62. Further, numerals 65, 66, and 67 designate a transparent glass substrate, a gate insulating film, and an interlayer insulating film, respectively.

However, the arrangement of the first TFT 53, the capacitor 54, the second TFT 55, and the anode 56 of the related examples do not take sufficient consideration of integration efficiency and therefore a more highly-integrated configuration is in demand.

Further, the color display device generally adopts a stripe arrangement as shown in FIG. 4A or a delta arrangement as shown in FIG. 4C as an arrangement for three primary colors of RGB. At the same time, it is necessary to use different luminescent materials for each of RGB such that discrete EL elements can directly emit light rays of respective RGB colors. Therefore, if the stripe arrangement shown in FIG. 4A is adopted, for example, a metal mask 70 shown in FIG. 4B may be used to form the luminescent layers as follows. First, a luminescent layer for R is formed by evaporating only an R color luminescent material onto the hole transport layer. Then, the metal mask 70 is displaced by a distance corresponding to one pixel in the horizontal direction to form a luminescent layer for G by evaporating only a G color luminescent materials on the hole transport layer. Finally, the metal mask 70 is further displaced by one pixel in the horizontal direction to form a luminescent layer for B by evaporating only a B color luminescent material. In the case of the delta arrangement shown in FIG. 4C, the luminescent layers can be similarly formed using the metal mask shown in FIG. 4D.

The above mentioned layer forming methods are disadvantageous in that, if dimensions of the metal mask or positioning at the time of metal mask displacement is not accurate, color purity is lowered because colors are mixed in adjoining pixels. Therefore, if a further highly integrated configuration is desired, a problem of positioning accuracy in the metal mask may occur.

SUMMARY OF THE INVENTION

The present invention provides a color display device suitable for a highly integrated configurations.

In accordance with one aspect of the present invention, the ratio of the length in the horizontal direction to the length in the vertical direction with respect to the luminescent region in each pixel is set smaller than the ratio of the pixel pitch in the horizontal direction to the pixel pitch in the vertical direction with respect to a plurality of pixels. This configuration provides pixel space in the horizontal direction, and the color mixture between adjoining pixels which causes deterioration of color purity can be prevented, even when accuracy of displacing a metal mask for forming a pixel electrode is low.

In accordance with another aspect of the present invention, a capacitor is disposed in a region which adjoins the luminescent region of a pixel in the horizontal direction. Therefore, a highly integrated configuration can be achieved while offering space for positioning in the horizontal direction of a pixel.

In accordance with still another aspect of the present invention, a capacitor is disposed in a region which adjoins the luminescent region of a pixel in the horizontal and vertical directions. Therefore, a highly integrated configuration can be achieved while offering space for positioning in the horizontal and vertical directions of a pixel.

BRIEF DESCRIPTION OF THE DRAWINGS

These and other objects of the invention will be explained in the description below, in connection with the accompanying drawings, in which:

FIGS. 4A, 4B, 4C and 4D are views for explaining color arrangements used in a color EL display device;

DETAILED DESCRIPTION OF THE PREFERRED EMBODIMENTS

Preferred embodiments of the present invention will be described in further detail with reference to the accompanying drawings.

Figure 5:
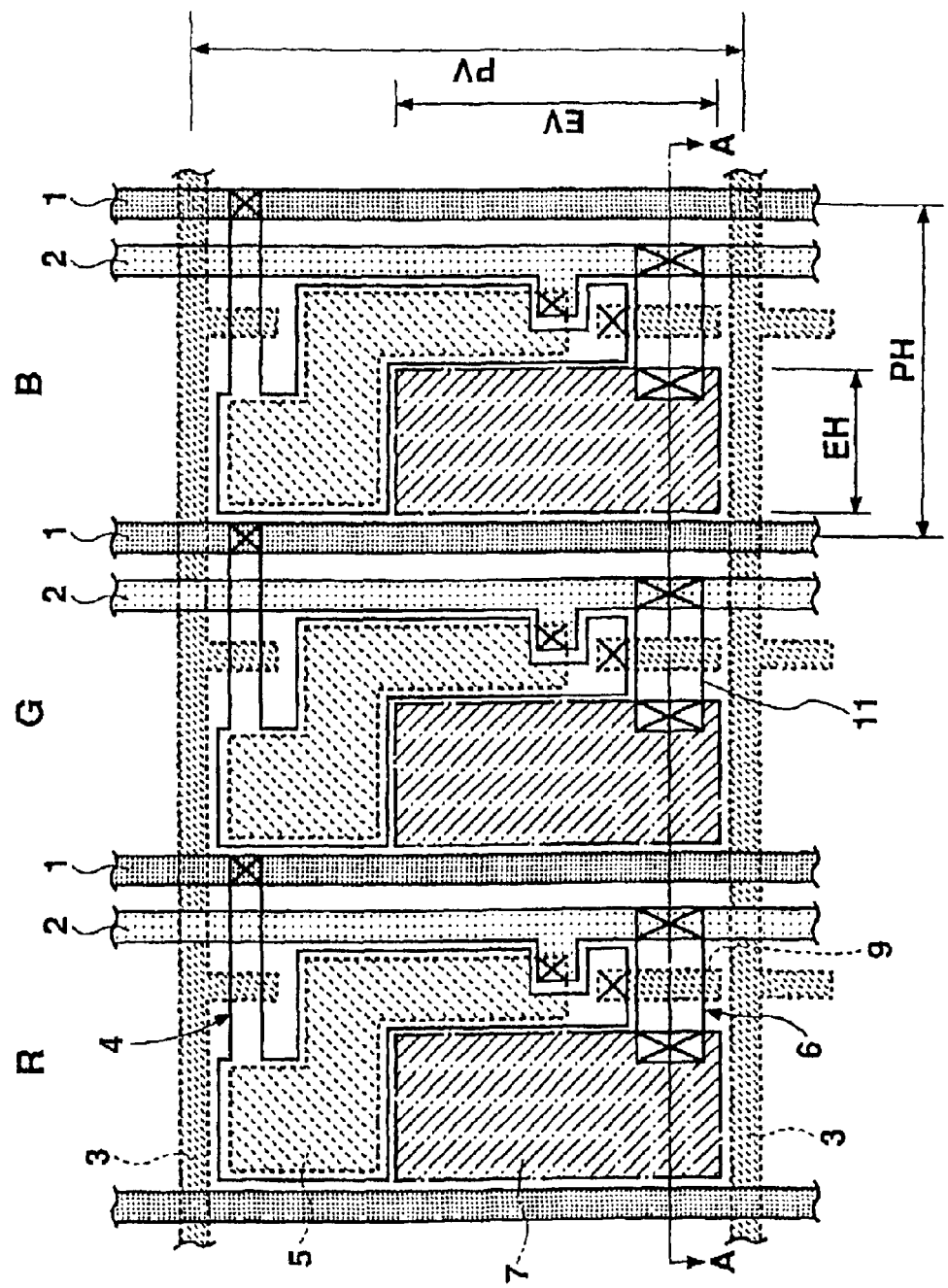
FIG. 5 is a plan view illustrating a first embodiment of the present invention.
Figure 6:
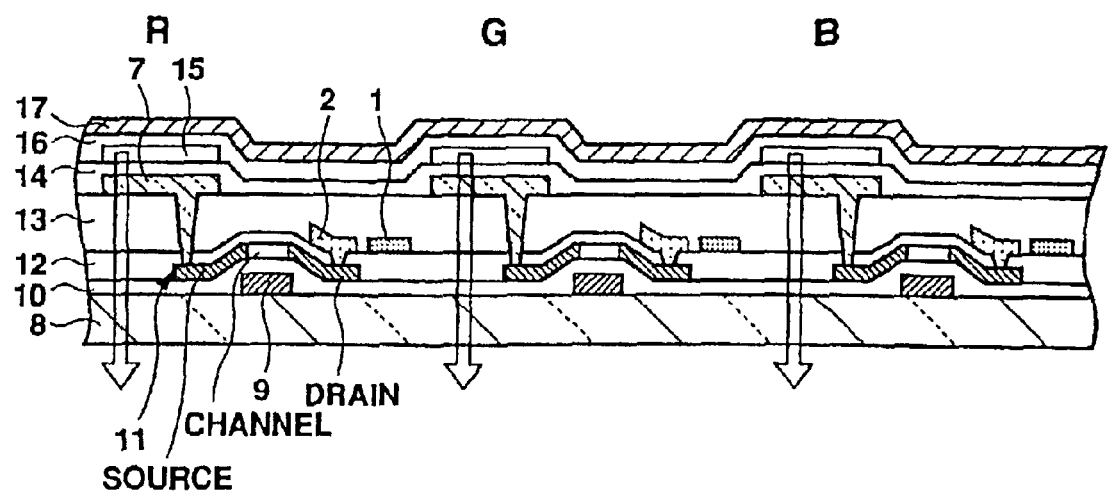
FIG. 6 is a cross section illustrating the first embodiment of the present invention.

Referring to FIG. 5, there is depicted in plan view a color EL display device according to one embodiment of the present invention. It should be noted in FIG. 5 that, for simplicity of explanation and ease of understanding, an organic layer and a cathode of an organic EL element are not shown and a basic configuration corresponding to three RGB pixels is shown. FIG. 6 is a cross section taken along a line A—A in FIG. 5. This embodiment will exemplify the configuration in which RGB pixels for color display are arranged in a stripe arrangement as shown in FIG. 4A.

Figure 1:
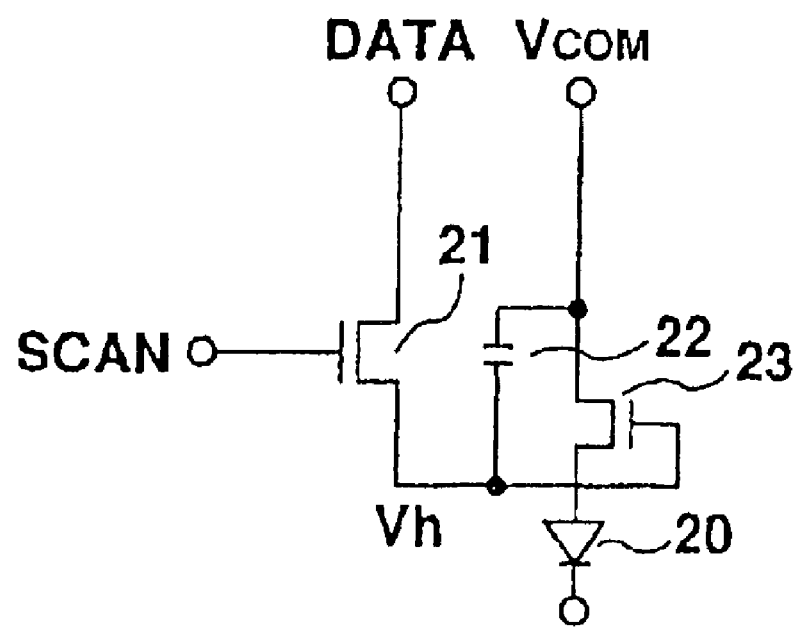
FIG. 1 is a view showing a circuit configuration of an active type color EL display device.
Figure 2:
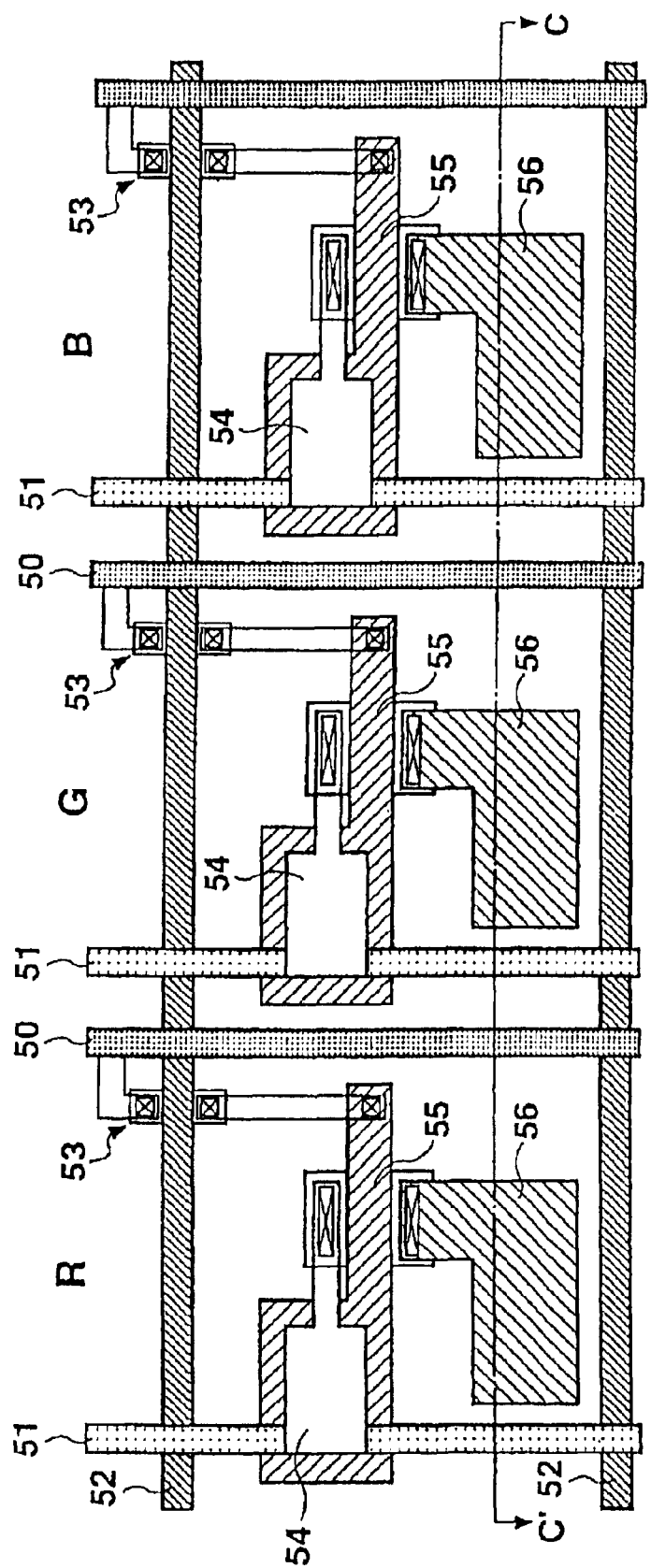
FIG. 2 is a plan view showing a configuration of a conventional color EL display device.
Figure 3:
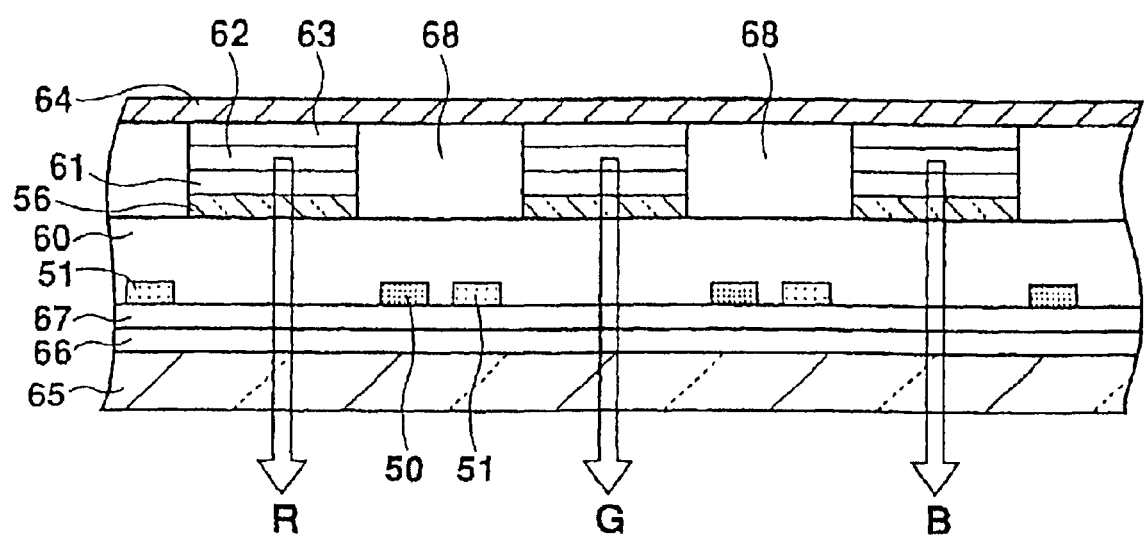
FIG. 3 is cross section showing a configuration of a conventional color EL display device.

A driving circuit for each pixel in this embodiment is the same as that in FIG. 1, and the configuration of the device differs from the example shown in FIGS. 2 and 3 in the pattern arrangement and the cross section.

Referring to FIGS. 5 and 6, the device comprises a data line 1 made of aluminum for supplying a display signal DATA, a power supply line 2 made of aluminum for supplying a power from a drive source COM, and a gate line made of chrome for supplying a scan signal SCAN. Each pixel of the EL display further comprises a first TFT 4 corresponding to the first TFT 21 in FIG. 1, a capacitor 5 corresponding to the capacitor 22 in FIG. 1, a second TFT 6 corresponding to the second TFT 23 in FIG. 1, and an anode (a first electrode) 7 of the EL element 20 comprising ITO and constituting an pixel electrode. In FIG. 5, regions enclosed by dot lines are formed by chromium, regions enclosed by chain lines are formed by ITO, and regions enclosed by solid lines other than the data line 1 and the power supply line 2 are formed using a polysilicon thin film.

The second TFT 6 is formed as follows. First, a gate electrode 9 is formed on a transparent glass substrate 8, and a gate insulating film 10 is formed thereupon. Then, a polysilicon thin film 11 formed on the gate insulating film 10 is covered with an interlayer insulating film 12, on which the data line 1 and the power supply line 2 are formed. A planarization insulating film 13 is further formed thereon and the anode 7 comprising ITO is finally formed on the planarization insulating film 13. Then, the drain region of the polysilicon thin film 11 is brought into contact with the power supply line 2 while the source region of the polysilicon thin film 11 is brought into contact with the anode 7.

The configuration of the first TFT 4 is substantially the same as that of the second TFT 6, with the notable exception that the drain region of the first TFT 4 is connected to the data line 1, and not to the power supply line 2. Further, the capacitor 5 connected to the first TFT 4 comprises a chromium electrode and a polysilicon thin film having a gate insulating film interposed therebetween.

The discrete anodes 7 are formed on the planarization insulating film 13 corresponding to respective pixels, and a hole-transport layer 14 is formed thereon so as to cover the entire pixels. Then, discrete emissive layers 15 are formed for each pixel, on which an electron-transport layer 16 and a cathode 17 are laminated in this order to complete formation of an EL element. Holes injected from the anode 7 and electrons injected from the cathode 17 are recombined inside the emissive layer 15, which emits light in the direction of the transparent anode toward outside, as indicated by arrows in FIG. 6. The discrete emissive layers 15 are formed for respective pixels to have substantially the same shape as the discrete anodes 7, and different emissive materials are used for each of the RGB colors. Thus, each EL element emits one type of RGB light.

Materials of, for example, MTDATA, $Alq_3$, and MgIn alloy may be used for the hole-transport layer 14, the electron-transport layer 16, and the cathode 17, respectively. Further, for example, Alq containing DCM type as dopant is used for the emissive layer 15 for R, Alq containing quinacridon as dopant is used for the emissive layer 15 for G, and DPVBi containing distyrylarylene or Perylene as dopant is used in the emissive layer 15 for B.

In this embodiment, as shown in FIG. 5, the second TFT 6 and part of the capacitor 5 are disposed in the horizontal direction with regard to the panel of the anode 7 which constitutes a pixel electrode, in other words, between the anode 7 of one pixel and another pixel, in particular the anode thereof, which adjoins in the horizontal direction and emits a color different from the one pixel. This configuration allows the pixel electrode to extend further in the vertical direction compared to the related art example shown in FIGS. 2 and 3. Further, the luminescent region of a pixel has substantially the same shape as the pixel electrode since the pixel electrode 7 and the emissive layer 15 have substantially the same shape. Accordingly, assuming that the dimensions of the luminescent region in the horizontal and vertical direction are EH and EV, respectively, and that the dimensions of the pixel pitch in the horizontal and vertical direction are PH and PV, respectively, EH/EV<PH/PV is found.

Thus, when forming respective RGB emissive layers by displacing metal masks for each RGB with one another in the horizontal direction with respect to the panel, as shown by an arrow in FIG. 4B, a room for such displacement of the metal masks in the horizontal direction is enlarged compared to the conventional configuration. As a result, the likelihood of colors in adjoining emissive layers being mixed can be reduced, even when emissive layers using different materials for each colors are formed with the same positioning accuracy as that in the related examples. Here, the first TFT 4, in place of the second TFT 6, may be disposed in the horizontal direction of the anode 7.

However, during the process for forming the luminescent layers by evaporating the luminescent materials, a so-called "diffusion" phenomenon is caused in which the luminescent materials are evaporated onto regions other than the regions directly under the openings of the metal masks 70 and 71. Due to such a diffusion phenomenon or inaccurate dimensions of the metal mask itself, the colors are adversely mixed in adjoining pixels to deteriorate color purity. In particular, in the case of the delta arrangement in which adjoining pixels, both in the column and row directions, have colors which are different from one another, this disadvantage is further notable.

In this embodiment, a portion of the capacitor 5 is disposed in the horizontal direction of the luminescent region and continuously extends in the vertical direction of the luminescent region. Thus, at least part of the capacitor 5 or a thin film transistor is disposed in the vertical direction of the luminescent layer of each pixel, such that space is provided between pixels in the vertical direction. Therefore, it is possible to achieve high quality display with preferable color purity, even when the accuracy of metal mask positioning is low.

Figure 7:
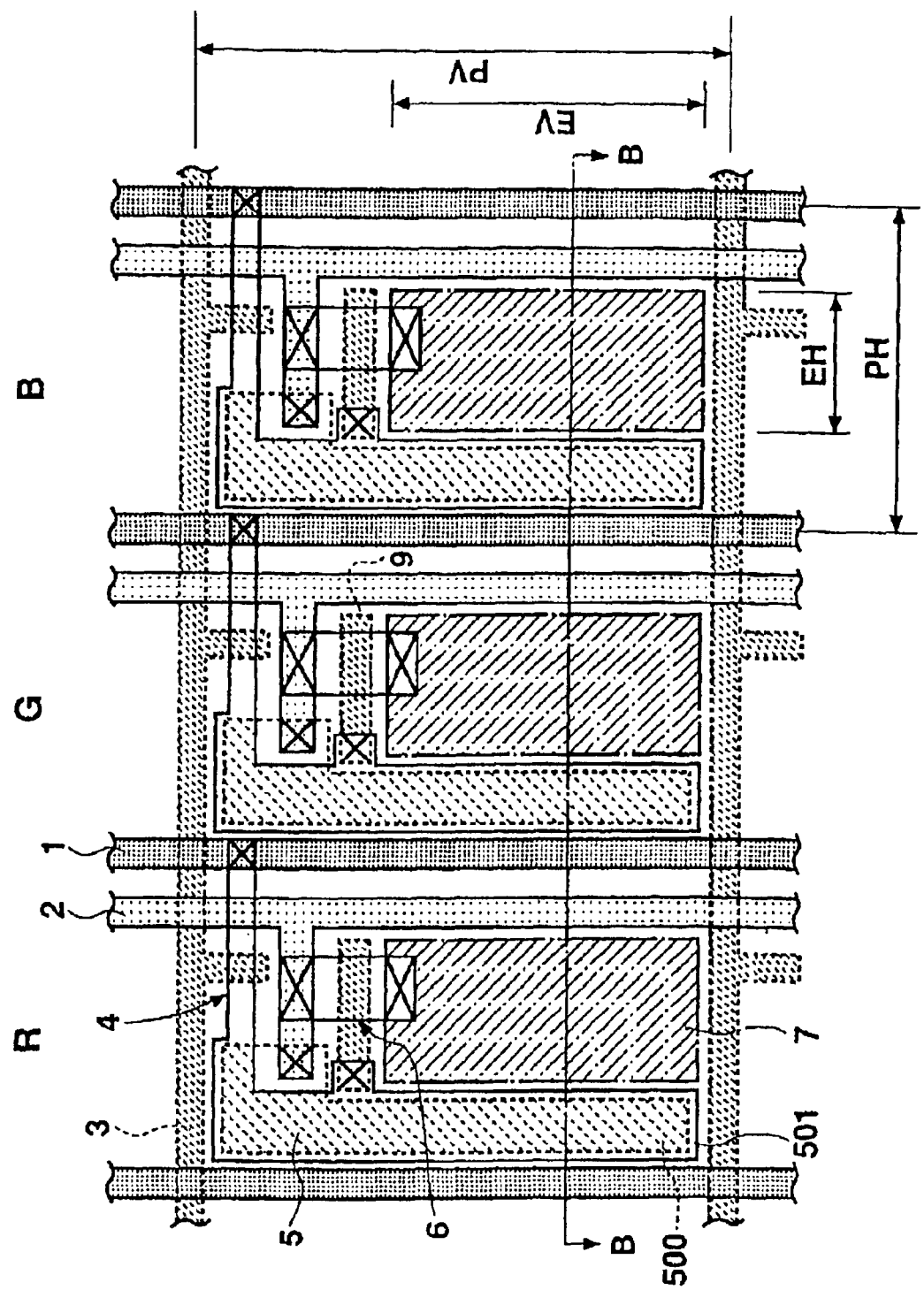
FIG. 7 is a plan view illustrating a second embodiment of the present invention.
Figure 8:
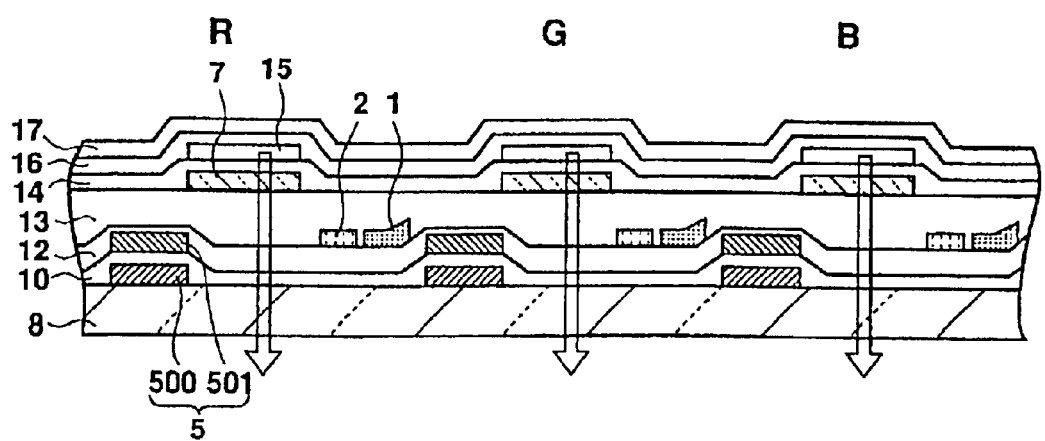
FIG. 8 is a cross section illustrating the second embodiment of the present invention.

FIG. 7 depicts, in plan view, the second embodiment of the present invention, and FIG. 8 is a cross section taken along line B—B of FIG. 7. It is to be noted that in these drawings the same elements as shown in FIGS. 5 and 6 are designated by the same reference numerals, and that the second embodiment differs from the first embodiment only in the pattern arrangement. Further in FIG. 7, as in FIG. 5, the organic layer and the cathode are eliminated for simplicity of explanation and ease of understanding.

In FIGS. 7 and 8, numeral 4 denotes a first TFT corresponding to the first TFT 21 of FIG. 1, numeral 5 denotes a capacitor corresponding to the capacitor 22 of FIG. 1, numeral 6 denotes a second TFT corresponding the second TFT 23 of FIG. 1, and numeral 7 denotes an anode comprising ITO and constituting a pixel electrode of the EL element 20. As clearly shown in FIG. 8, the capacitor 5 is constituted by a chromium electrode 500 and a polysilicon thin film 501 having a gate insulating film 10 therebetween.

In this embodiment, as shown in FIG. 7, the capacitor 5 is disposed next to the anode 7 which constitutes a pixel electrode in the horizontal direction with respect to the panel. Namely, as in the first embodiment, the capacitor 5 is necessarily disposed between the anode 7 of one pixel and the anode of another pixel which adjoins in the horizontal direction and emits a color different from the one pixel. This configuration allows the pixel electrode to extend further in the vertical direction than in the related art example shown in FIGS. 2 and 3. Further, as in the foregoing embodiment, when the dimensions of the luminescent region in the horizontal and vertical directions are EH and EV, respectively, and the dimensions of the pixel pitch in the horizontal and vertical directions are PH and PV, respectively, the relationship EH/EV<PH/PV is found true.

Thus, when forming respective RGB emissive layers such that metal masks for each RGB are displaced with each other in the horizontal direction with respect to the panel, as shown by an arrow in FIG. 6B, a room for such displacement of the metal masks in the horizontal direction is enlarged compared to the conventional configuration. As a result, the possibility that colors in the adjoining emissive layers may be mixed can be diminished even when the respective emissive layers are formed with the same positioning accuracy as that in the related examples.

According to this embodiment, the capacitor 5 is disposed in the horizontal direction of the luminescent region, and both of the first and the second TFTs 4 and 6 are disposed in the vertical direction of the luminescent region. Thus, a gap between the luminescent regions in adjoining pixels in the horizontal direction can be secured by the capacitor 5 while a gap between the luminescent regions in adjoining pixels in the horizontal direction can be secured by the TFTs 4 and 6, thereby further preventing color blur due to diffusion, as in the first embodiment.

It is to be noted that features other than the capacitor 5 may, of course, be disposed to secure the gaps between the luminescent regions. However, a capacitor is most preferable for the following reason. Namely, since the capacity is proportional to the area in a capacitor, by increasing the capacity of a capacitor so as to securely hold a voltage Vh in accordance with a display signal Data, the area of the capacitor can be increased to secure necessary gaps. Accordingly, it is most efficient to adjust the gaps by disposing the capacitor 5.

According to the present invention, color mixture in adjoining pixels which causes deterioration of color purity can be prevented in an active type color EL display device, thereby maintaining a preferable color purity even in a highly detailed display.

Specifically, by setting the ratio of the horizontal length to the vertical length of the luminescent region of each pixel to be smaller that the ratio of the horizontal pixel pitch to the vertical pixel pitch, space is provided in each pixel in the horizontal direction such that a high quality display can be produced, even when accuracy for metal mask displacement is low.

Further, by disposing at least part of a capacitor or a thin film transistor in the horizontal direction of the luminescent region of each pixel, space is provided in each pixel in the horizontal direction such that highly detailed display can be achieved even when metal mask displacement accuracy is low.

Although the present invention is also applicable to a delta pixel arrangement, the above-mentioned effects are especially significant when employed with a stripe arrangement.

What is claimed is:

1. An electroluminescence display device in which a plurality of pixels are arranged in horizontal and vertical directions, wherein:

each of said pixels comprises:

an EL element having a luminescent layer between an anode and a cathode;

a thin film transistor for driving said EL element; and a capacitor for holding a voltage to be supplied to said thin film transistor, and wherein said thin film transistor is disposed in a region which adjoins the EL element of the pixel in the horizontal direction.

2. An electroluminscence display device according to claim 1, wherein said capacitor does not interpose between said thin film transistor and said EL element.

3. An electroluminescence display device according to claim 1, wherein a luminescent region of each pixel has an elongated shape wherein the vertical sides longer than the horizontal sides.

4. An electroluminescence display device according to claim 3, wherein a pixel electrode is provided in each pixel corresponding to the luminescent region.

5. An electroluminescence display device according to claim 1, wherein said plurality of pixels are arranged in a matrix so as to form a stripe arrangement in which pixels having the same color adjoin one another in the column direction.

6. An electroluminescence display device according to claim 1, wherein a plurality of different materials are used for the luminescent layer in said EL element, such that each EL element emits a color corresponding to the luminescent material.

7. An electroluminescence display device according to claim 6, wherein said luminescent materials comprise materials for emitting one of R (red), G (green) and B (blue), such that each EL element emits one of these RGB colors.

8. An electroluminescence display device according to claim 1, wherein said capacitor is disposed in a region which adjoins a luminescent region in the horizontal and vertical directions.

9. An electroluminescence display device according to claim 8, wherein said capacitor is continuous and extends in an L shape in a region which adjoins a luminescent region in the horizontal and vertical directions.

10. An electroluminescence display device according to claim 1, wherein said thin film transistor or at least part of said capacitor is disposed in a region which adjoins a luminescent region in the horizontal direction.

11. An electroluminescence display device according to claim 1, wherein said capacitor is formed to have a bent portion.

12. An electroluminescence display device according to claim 11, wherein said capacitor bends in an L shape and is disposed in a region which adjoins a luminescent region in the horizontal and vertical directions.

13. An electroluminescence display device in which a plurality of pixels are arranged in horizontal and vertical directions, wherein:

a plurality of data lines extending in a first direction are provided;

a plurality of power supply lines extending to not intersect said data lines are provided;

each of said pixels comprises:

an EL element having a luminescent layer between an anode and a cathode;

a thin film transistor for driving said EL element; and a capacitor for holding a voltage to be supplied to said thin film transistor, and wherein said data line, said EL element, said thin film transistor, and said power supply line are repeatedly disposed in that order in a second direction intersecting said first direction.

14. An electroluminescence display device according to claim 13, wherein said data line, said EL element, said thin film transistor, and said power supply line are repeatedly disposed in that order, said capacitor does not interpose between any of said data line, said EL element, said thin film transistor, and said power supply line.

15. An electroluminescence display device according to claim 13, wherein a luminescent region of each pixel has an elongated shape wherein the vertical sides longer than the horizontal sides.

16. An electroluminescence display device according to claim 15, wherein a pixel electrode is provided in each pixel corresponding to the luminescent region.

17. An electroluminescence display device according to claim 13, wherein said plurality of pixels are arranged in a matrix so as to form a stripe arrangement in which pixels having the same color adjoin one another in the column direction.

18. An electroluminescence display device according to claim 13, wherein a plurality of different materials are used for the luminescent layer in said EL element, such that each EL element emits a color corresponding to the luminescent material.

19. An electroluminescence display device according to claim 18, wherein said luminescent materials comprise materials for emitting one of R (red), G (green) and B (blue), such that each EL element emits one of these RGB colors.

20. An electroluminescence display device according to claim 13, wherein said capacitor is disposed in a region which adjoins a luminescent region in the horizontal and vertical directions.

21. An electroluminescence display device according to claim 20, wherein said capacitor is continuous and extends in an L shape in a region which adjoins a luminescent region in the horizontal and vertical directions.

22. An electroluminescence display device according to claim 13, wherein said thin film transistor or at least part of said capacitor is disposed in a region which adjoins a luminescent region in the horizontal direction.

23. An electroluminescence display device according to claim 13, wherein said capacitor is formed to have a bent portion.

24. An electroluminescence display device according to claim 23, wherein said capacitor bends in an L shape and is disposed in a region which adjoins a luminescent region in the horizontal and vertical directions.

* * * * *